(12) United States Patent
Nishikawa et al.

(10) Patent No.: US 7,049,744 B2
(45) Date of Patent: May 23, 2006

(54) ORGANIC ELECTROLUMINESCENCE PANEL HAVING A SUBSTRATE AND A SEALING PANEL SEALED BY ADHERING AN INORGANIC FILM AND THE SEALING PANEL USING A SEALING MATERIAL

(75) Inventors: Ryuji Nishikawa, Gifu (JP); Koji Suzuki, Aichi (JP); Shinji Ichikawa, Hashima (JP)

(73) Assignee: Sanyo Electric Co., Ltd. (JP)

( * ) Notice: Subject to any disclaimer, the term of this patent is extended or adjusted under 35 U.S.C. 154(b) by 26 days.

(21) Appl. No.: 10/448,990

(22) Filed: May 29, 2003

(65) Prior Publication Data

US 2004/0012870 A1 Jan. 22, 2004

(30) Foreign Application Priority Data

May 30, 2002 (JP) .............................. 2002-158178

(51) Int. Cl.
*H05B 33/04* (2006.01)
(52) U.S. Cl. ...................... 313/512; 313/500; 257/350; 257/383; 428/690
(58) Field of Classification Search ........ 313/500–509, 313/512, 495; 315/169.3; 257/350, 383; 428/690
See application file for complete search history.

(56) References Cited

U.S. PATENT DOCUMENTS

| | | | | |
|---|---|---|---|---|
| 6,246,179 B1 * | 6/2001 | Yamada | .................... | 315/169.3 |
| 6,281,552 B1 * | 8/2001 | Kawasaki et al. | .......... | 257/350 |
| 6,303,963 B1 * | 10/2001 | Ohtani et al. | ................ | 257/350 |
| 6,432,516 B1 | 8/2002 | Terasaki et al. | ............. | 428/195 |
| 6,590,337 B1 * | 7/2003 | Nishikawa et al. | ......... | 313/509 |
| 6,597,121 B1 * | 7/2003 | Imura | ....................... | 315/169.3 |
| 6,605,826 B1 * | 8/2003 | Yamazaki et al. | ............. | 257/72 |
| 6,720,198 B1 * | 4/2004 | Yamagata et al. | ............. | 438/29 |
| 6,781,306 B1 * | 8/2004 | Park | ........................... | 313/505 |
| 6,864,629 B1 | 3/2005 | Miyaguchi et al. | ......... | 313/512 |
| 2003/0122983 A1 * | 7/2003 | Kim et al. | .................... | 349/43 |
| 2003/0168966 A1 * | 9/2003 | Kobayashi et al. | ......... | 313/495 |

FOREIGN PATENT DOCUMENTS

JP 2001102166 A * 4/2001

OTHER PUBLICATIONS

Copy of Office Action for corresponding Korean patent application No. 10-2003-0034280 with English excerpt translation.
Copy of Japanese Patent Laid-Open Publication No. 2000-208250 with English abstract.
Copy of Japanese Patent Laid-Open Publication No. 2000-223264 with English abstract.
Copy of Korean Patent Laid-Open Publication No. 2002-23028 with its English abstract and English translation of drawings.
Copy of International Publication No. WO 98/46424.

* cited by examiner

*Primary Examiner*—Karabi Guharay
*Assistant Examiner*—Sikha Roy
(74) *Attorney, Agent, or Firm*—Cantor Colburn LLC

(57) ABSTRACT

To effectively prevent intrusion of moisture into a space above an organic EL element, a moisture blocking layer made of a silicon-based nitride film such as SiNx or a TEOS film formed to cover a drain electrode and source electrode of a TFT is formed on the entire surface of the element. A sealing glass is attached to the moisture blocking layer by a sealing material on the peripheral region of the substrate. The intrusion of moisture from the outside is effectively prevented by the moisture blocking layer.

13 Claims, 2 Drawing Sheets

ORGANIC ELECTROLUMINESCENCE PANEL HAVING A SUBSTRATE AND A SEALING PANEL SEALED BY ADHERING AN INORGANIC FILM AND THE SEALING PANEL USING A SEALING MATERIAL

BACKGROUND OF THE INVENTION

1. Field of the Invention

The present invention relates to an organic electroluminescence (hereinafter abbreviated simply as "EL") panel having organic EL elements provided in a matrix form and a plurality of thin film transistors for driving the organic EL elements, both of which are formed on a substrate.

2. Description of the Related Art

Organic EL display panels are known as a type of flat display panel. Unlike liquid crystal display (LCD) panels, the organic EL display panels are self-emissive and commercialization of organic EL display panels in flat display panels which are bright and clear is highly expected.

An organic EL display is constructed by placing a plurality of pixels each having an organic EL element in an matrix form. As a method for driving the organic EL element, similar as in LCDs, a passive method and an active method are known. Of these, also similar to LCDs, the active matrix method is generally considered more desirable. That is, an active matrix method in which one or more switching elements (typically, one for switching and one for driving) are provided for each pixel and the display in each pixel is controlled by controlling the switching element is more advantageous than a passive method which does not have a switching element for each pixel, because the active matrix method enables higher resolution display.

An organic EL element emits light when an electric current is applied through an organic emissive layer. In order to enhance the emission capability, in many cases, a hole transport layer composed of an organic compound and/or an electron transport layer composed of an organic compound are provided adjacent to the organic emissive layer. These organic layer are easily degraded by moisture.

To address this problem, in an organic EL display, the region above the organic EL element is commonly covered by a metal cathode, a space above a display region (a region where a pixel is formed) in which an organic EL element is placed is sealed to form an airtight space, and a desiccant is placed within the airtight space to remove excess moisture.

However, conventional organic EL display panels configured in this manner have, in many cases, insufficient lifetime. After extensive study of the panels, the present inventors have found that in many cases the lifetime is unnecessarily shortened because the desiccant in the space above the organic EL element is insufficient. That is, in many cases, intrusion of moisture from the outside is not prevented to a sufficient degree.

SUMMARY OF THE INVENTION

The present invention advantageously provides an organic EL panel in which intrusion of moisture into a space above an organic EL element can be effectively prevented.

According to one aspect of the present invention, an inorganic film such as a silicon-based nitride film or a silicon-based oxide film is provided which, along with a sealing material, separates the inner space of the organic EL panel from the outside. In the conventional structures, because a planarization film provided on the thin film transistor and made of an organic compound is present below the sealing material, there is a possibility that moisture may intrude from the outside through this structure. In the present invention, such a problem is reliably solved using an inorganic film such as a silicon-based nitride film or a silicon-based oxide film.

DESCRIPTION OF PREFERRED EMBODIMENTS

Preferred embodiments of the present invention (hereinafter referred to simply as "embodiments") will now be described with reference to the drawings.

Figure 1:
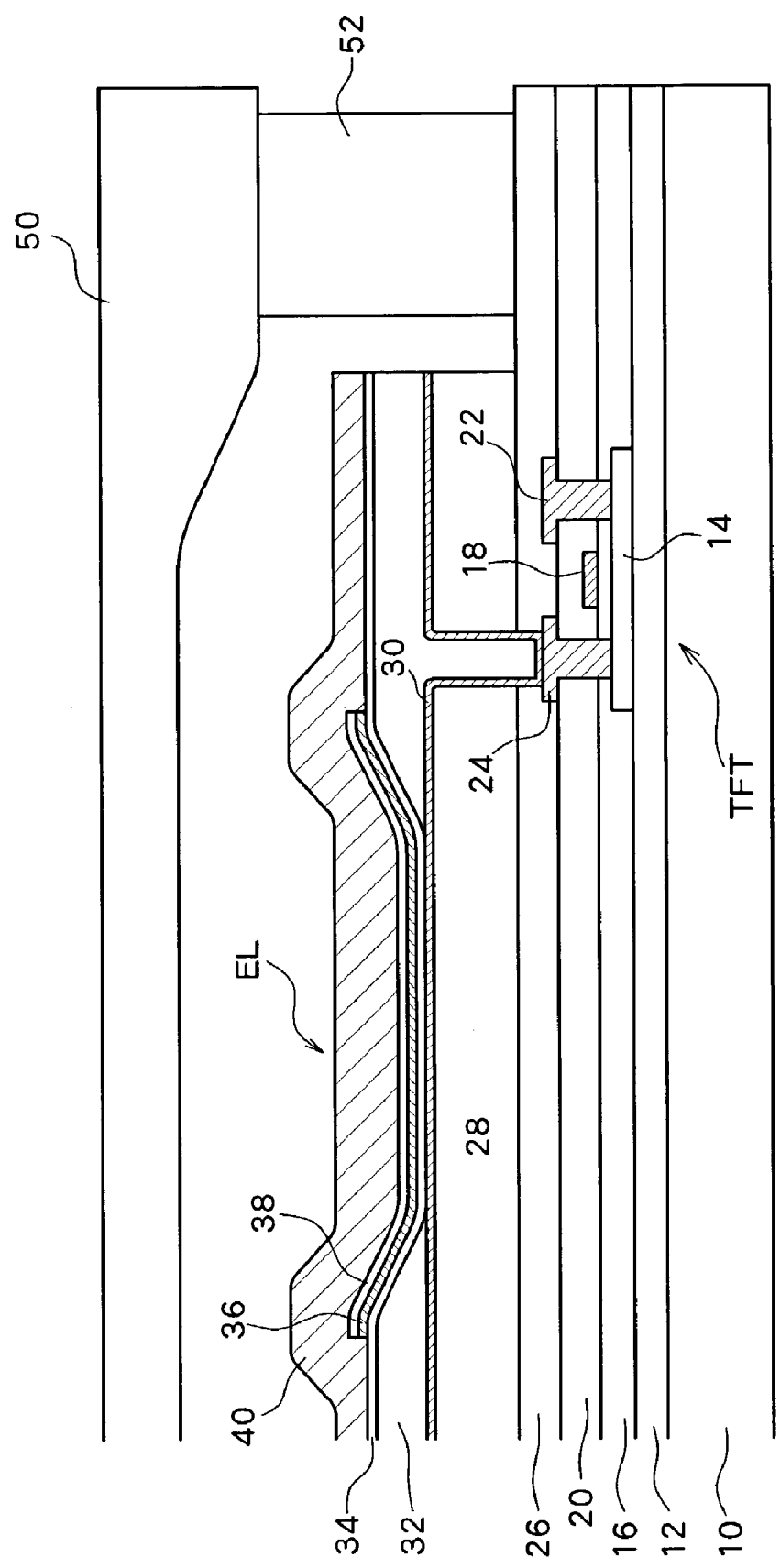
FIG. 1 is a cross sectional diagram showing especially significant sections of the structure of a preferred embodiment according to the present invention.

FIG. 1 is a cross sectional diagram showing important sections of an embodiment of the present invention. An insulating film 12 having a two-layer structure of $SiO_2$ and SiNx layered in that order is formed on a glass substrate 10 to prevent intrusion of impurities from the glass substrate 10. A plurality of thin film transistors (hereinafter referred to simply as "TFTs") are formed in designated positions above the insulating film 12. In FIG. 1, a second TFT is shown which is a TFT for controlling current from a power supply line to an organic EL element. In each pixel, a first TFT is also provided for controlling the accumulation of voltage from the data line to a capacitor. The second TFT is switched on in response to a voltage accumulated in the capacitor and controls an electric current flowing from the power supply line to the organic EL element.

A semiconductor layer 14 made of polycrystalline silicon and which forms an active layer is formed above the insulating film 12 and a gate insulating film 16 is formed to cover the semiconductor layer 14, the gate insulating film 16 made of a two-layer film in which $SiO_2$ and SiNx are layered, in that order. Above a central portion of the semiconductor layer 14, a gate electrode 18 made of Mo or the like is formed with the gate insulating film 16 therebetween, and an interlayer insulating film 20 is formed to cover these layers, the gate insulating film 16 made of a two-layered insulating film in which SiNx and $SiO_2$ are layered in that order. In addition, above both side sections of the semiconductor layer 14, contact holes are formed in the interlayer insulating film 20 and in the gate insulating film 16 and a drain electrode 22 and a source electrode 24 which are made of, for example, aluminum are formed.

Furthermore, a moisture blocking layer 26 is formed on the entire surface covering the interlayer insulating film 20, drain electrode 22, and source electrode 24, the moisture blocking layer 26 made of an SiNx film or a TEOS film.

Above the moisture blocking layer 26, a first planarization film 28 made of an organic material such as an acrylic resin is formed and a transparent electrode 30 made of ITO or the like is formed above the first planarization film 28 as an anode of the organic EL element for each pixel.

A portion of the transparent electrode 30 extends to a region above the source electrode 24 and is formed within a contact hole provided in this region to expose a portion of the upper surface of the source electrode. In this manner, the source electrode 24 and the transparent electrode 30 are directly connected.

A peripheral region of the pixel region of the transparent electrode 30 other than the emissive region is covered by a second planaraization film 32 made of an organic compound similar to the first planarization film 28.

A hole transport layer 34 is formed on the second planarization film 32 and the transparent electrode 30 to entirely cover these layers. Because an opening is formed through the second planarization film 32 in the region corresponding t the emissive region, the hole transport layer 34 directly contacts the transparent electrode 30 which is the anode in the emissive region. Moreover, an emissive layer 36 and an electron transport layer 38 divided for each pixel and having a size slightly larger than the emissive region are layered on the hole transport layer 34, in that order. A cathode 40 made of aluminum or the like is formed on the electron transport layer 38.

With this structure, when the second TFT is switched on, a current is supplied through the source electrode 24 to the transparent electrode 30 of the organic EL element, the current flows between the transparent electrode 30 and the cathode 40, and the organic EL element emits light in response to the flowing current.

In this embodiment, the insulating film 12, gate insulating film 16, interlayer insulating film 20, and moisture blocking layer 26 are all formed to cover the entire surface of the glass substrate 10 including the peripheral region. The first planarization film 28, second planarization film 32, hole transport layer 34, and cathode 40, on the other hand, are formed to end before they reach the peripheral region. In other words, as shown in FIG. 1, with respect to the glass substrate 10, a sealing material 52 for attaching a sealing glass 50 is attached to the moisture blocking layer 26 formed above the glass substrate 10.

As the sealing material 52, a UV-curable resin, such as an epoxy resin, is directly adhered to the moisture blocking layer 26. The moisture blocking layer 26 is formed of a silicon-based nitride film such as SiNx and does not allow moisture from the outside to transfer into the inside. In this manner, it is possible to effectively prevent intrusion of moisture from the outside into the internal space of the sealing glass 50.

In the conventional structures, the first and second planarization films 28 and 32 are also formed below the sealing material 52 above the glass substrate 10. These first and second planarization films 28 and 32 are each made of an organic material such as an acrylic resin which has a relatively high water absorbing capability compared to SiNx or the like. Therefore, in the conventional structures, these layers tend to allow moisture to pass into the inside of the panel. In this embodiment, on the other hand, the thin film transistor provided within the structure is covered by a silicon-based nitride film such as SiNx which has a high water preventing capability. In such a structure, the space where the organic EL element is provided is essentially surrounded by the moisture blocking film 26, sealing material 52, and sealing glass 50 so that intrusion of moisture to reach the organic EL element is effectively prevented.

Figure 2:
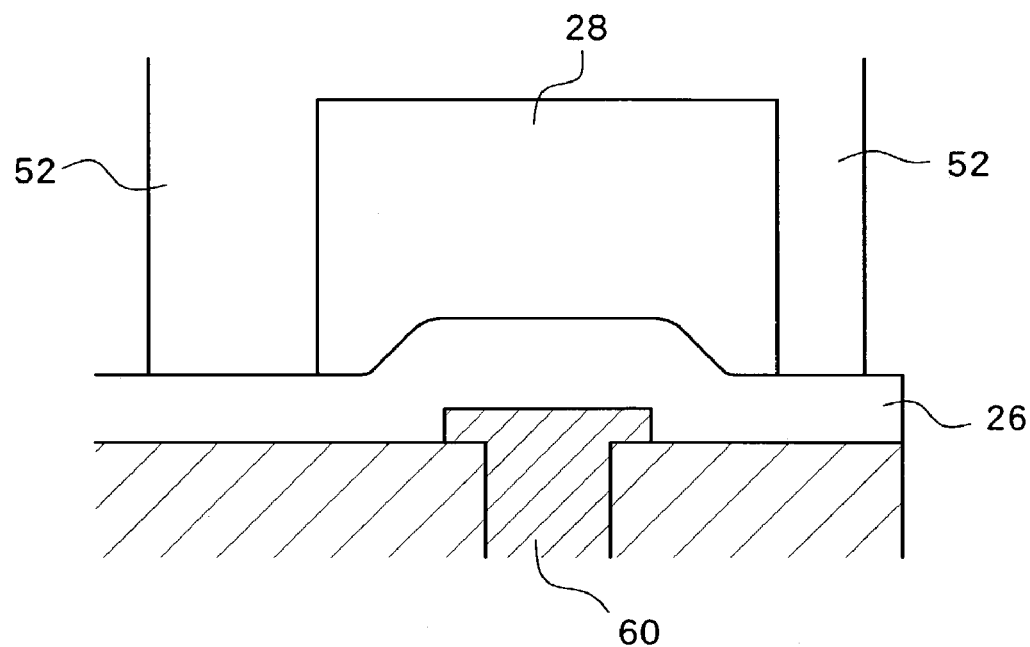
FIG. 2 is a cross sectional diagram showing a portion of the sealing material according to another preferred embodiment of the present invention.

FIG. 2 shows a structure of another preferred embodiment according to the present invention. In this embodiment, a portion of the first planarization film 28 is provided inside the sealing material 52. More specifically, in many cases, a driver circuit is provided on the peripheral region of the glass substrate 10 onto which the sealing material 52 is to be formed. This driver circuit also contains a plurality of thin film transistors. These thin film transistors for driving are formed on the glass substrate 10 simultaneously with the first and second TFTs typically provided in each pixel. Therefore, in many cases, thin film transistors exist below the sealing material 52. In these cases, the electrode 60 of the thin film transistor protrudes over the interlayer insulating film 20 and a step is formed in the moisture blocking layer 26 covering the electrode 60. Although such a structure does not pose a problem when the moisture blocking layer 26 is formed in a sufficiently large thickness, in practice, the moisture blocking layer 26 cannot be formed to a sufficiently large thickness, and, therefore, a protruding area, or step section, corresponding to the shape of the electrode 60 is created, resulting in a possible problem in that the electrode 60 cannot be sufficiently covered by the moisture blocking layer 26 around the step section.

To address this disadvantage, in this embodiment, a portion of the first planarization film 28 is formed within the region corresponding to the electrode 60 as an electrode protection layer to cover the step produced in the moisture blocking layer 26. In this manner, the step section of the moisture blocking layer 26 can be covered by the first planarization film 28 which also functions as a buffer layer and the structural deficiency of the moisture blocking layer 26 caused by the presence of the electrode 60 can be compensated for.

Figure 3:
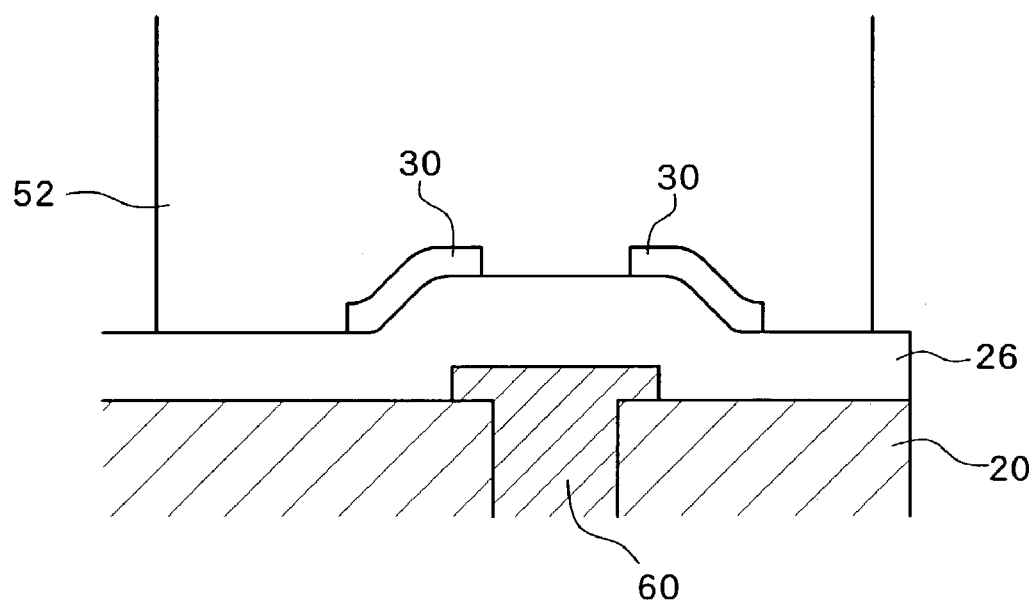
FIG. 3 is a cross sectional diagram showing a portion of the sealing material according to yet another preferred embodiment of the present invention.

FIG. 3 shows a structure according to yet another preferred embodiment of the present invention. In this embodiment, a portion of a transparent electrode 30 is retained as an electrode protection layer for covering a step section in a moisture blocking layer 26 caused by the presence of an electrode 60. In other words, when the transparent electrode 30 is formed, a portion covering the moisture blocking layer 26, that is, a buffer layer, is also formed above and in a region surrounding the electrode 60. Similar to the above embodiment, with this structure, it is possible to compensate for the disadvantageous structure of the moisture blocking layer 26 resulting from the presence of the electrode 60. In other words, a disadvantage which occurs when the coverage of the moisture blocking layer 26 is insufficient that the etching solution used for formation of the transparent electrode 30 intrudes from the portion where the coverage is insufficient, resulting undesirable etching of the electrode 60 can be compensated for.

As described, according to the preferred embodiments of the present invention, a silicon-based nitride film or a silicon-based oxide film is provided and the internal space of the organic EL panel is separated from the outside by the silicon-based nitride film or the silicon-based oxide film and a sealing material. In the conventional structures, because planarization films each made of an organic compound and formed on the thin film transistor are present below the sealing material, there is a possibility that moisture may intrude from the outside through these structures. According to the preferred embodiments of the present invention, such a problem can be reliably solved using a silicon-based nitride film or silicon-based oxide film.

By covering thin film transistors using a buffer structure, it is possible to remove adverse effects of steps produced in the silicon-based nitride film or the silicon-based oxide film caused by the presence of the electrode of the thin film transistor.

What is claimed is:
1. An organic electroluminescence panel comprising:
 a substrate onto which a plurality of organic EL elements provided in a matrix form and a plurality of thin film transistors for driving the organic EL elements are formed; and a sealing panel for sealing a region above a pixel area in which the organic EL elements are provided, attached to a peripheral region of the substrate, wherein
an inorganic film and an organic film are formed over the upper surface of the substrate,
the organic EL elements are provided above the thin film transistors, the inorganic film, and the organic film on the substrate,
the substrate and the sealing panel are sealed by adhering the inorganic film and the sealing panel using a sealing material, and
the organic EL element is formed of layers above the thin film transistor on the substrate, and the inorganic film is formed to cover the thin film transistor.

2. An organic electroluminescence panel comprising:
a substrate onto which a plurality of organic EL elements provided in a matrix form and a plurality of thin film transistors for driving the organic EL elements are formed; and
a sealing panel for sealing a region above a pixel area in which the organic EL elements are provided, attached to a peripheral region of the substrate, wherein
an inorganic film and an organic film are formed over the upper surface of the substrate,
the organic EL elements are provided above the thin film transistors, the inorganic film, and the organic film on the substrate,
the substrate and the sealing panel are sealed by adhering the inorganic film and the sealing panel using a sealing material,
a portion of the thin film transistor is placed below the sealing material on the substrate,
a source electrode or a drain electrode of the thin film transistor below the sealing material is present below the sealing material, an electrode protection layer is provided to cover these electrodes, and the electrode protection layer is covered by the sealing material, and
a planarization film is formed between the organic EL element and the inorganic film, the planarization film ending at a position internal to the position where the substrate and the sealing panel are sealed, and the electrode protection layer is formed of the same material as the planarization film.

3. An organic electroluminescence panel according to claim 2, wherein the electrode protection layer and the planarization film are organic films.

4. An organic electroluminescence panel comprising:
a substrate onto which a plurality of organic EL elements provided in a matrix form and a plurality of thin film transistors for driving the organic EL elements are formed; and
a sealing panel for sealing a region above a pixel area in which the organic EL elements are provided, attached to a peripheral region of the substrate, wherein
an inorganic film is formed over the upper surface of the substrate,
the substrate and the sealing panel are sealed by adhering the inorganic film and the sealing panel using a sealing material,
the organic EL element is formed of layers above the thin film transistor on the substrate,
the inorganic film is formed to cover the thin film transistor,
the organic EL element is formed of layers above the inorganic film on the substrate,
the organic EL element is formed of layers above a planarization film formed on the inorganic film, and
the planarization film ends at a position internal to the position where the substrate and the sealing panel are sealed.

5. An organic electroluminescence panel according to claim 4, wherein
the inorganic film is a silicon-based nitride film.

6. An organic electroluminescence panel according to claim 4, wherein
the inorganic film is a silicon-based oxide film.

7. An organic electromluminescence panel according to claim 4, wherein
the planarization film is an organic film.

8. An organic electroluminescence panel according to claim 4, wherein
a portion of the thin film transistor is placed below the sealing material on the substrate.

9. An organic electroluminescence panel according to claim 8, wherein
when a source electrode or a drain electrode of the thin film transistor below the sealing material is present below the sealing material, an electrode protection layer is provided to cover these electrodes, and the electrode protection layer is covered by the sealing material.

10. An organic electroluminescence panel according to claim 9, wherein
a planarization film is formed between the organic EL element and the inorganic film, the planarization film ending at a position internal to the position where the substrate and the sealing panel are sealed, and
the electrode protection layer is formed of the same material as the planarization film.

11. An organic electroluminescence panel according to claim 10, wherein
the electrode protection layer and the planarization film are organic films.

12. An organic electroluminescence panel comprising:
a substrate onto which a plurality of organic EL elements provided in a matrix form and a plurality of thin film transistors for driving the organic EL elements are formed; and
a sealing panel for sealing a region above a pixel area in which the organic EL elements are provided, attached to a peripheral region of the substrate, wherein
an inorganic film is formed over the upper surface of the substrate,
a planarization film is formed above the inorganic film,
the organic EL element is formed above the planarization film,
the substrate and the sealing panel are sealed by adhering the inorganic film and the sealing panel using a sealing material,
the planarization film ends before reaching a seal, and
a portion of the planarization film ends at a position internal to the sealing material,
an electrode is placed below the sealing material, and
a portion of the planarization film covers the electrodes provided below the sealing material.

13. An organic electroluminescence panel according to claim 12, wherein
the planarization film is an organic film.

* * * * *